United States Patent [19]

Miyasaka et al.

[11] 4,392,212
[45] Jul. 5, 1983

[54] SEMICONDUCTOR MEMORY DEVICE WITH DECODER FOR CHIP SELECTION/WRITE IN

[75] Inventors: Kiyoshi Miyasaka, Yokohama; Mitsuo Higuchi, Tokyo, both of Japan

[73] Assignee: Fujitsu Limited, Kawasaki, Japan

[21] Appl. No.: 206,131

[22] Filed: Nov. 12, 1980

[30] Foreign Application Priority Data

Nov. 12, 1979 [JP] Japan .............................. 54-146346

[51] Int. Cl.³ .............................................. G11C 8/00
[52] U.S. Cl. .................................................... 365/230
[58] Field of Search ......................................... 365/230

[56] References Cited

U.S. PATENT DOCUMENTS 3,969,706  7/1976  Proebsting et al. ................. 365/230
4,200,919  4/1980  Page et al. ........................... 365/230

FOREIGN PATENT DOCUMENTS 2136771  2/1973  Fed. Rep. of Germany ...... 365/230

OTHER PUBLICATIONS

Hession et al., IBM Tech. Disc. Bul., vol. 21, No. 4, 9/78, pp. 1563-1564, "Chip Select Technique for Multi-Chip Decoding".

Primary Examiner—Stuart N. Hecker
Attorney, Agent, or Firm—Staas & Halsey

[57] ABSTRACT

A semiconductor memory device includes in its chip a decoder circuit which receives external selection signals for selecting a memory chip. The decoder circuit performs the selection of the memory chip in accordance with a logic corresponding to the combination of the external selection signals. The selection logic can be changed by the user of the semiconductor device.

12 Claims, 6 Drawing Figures

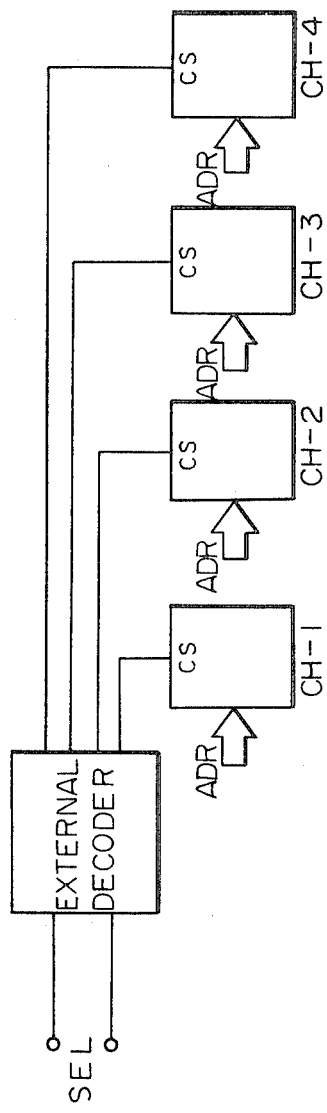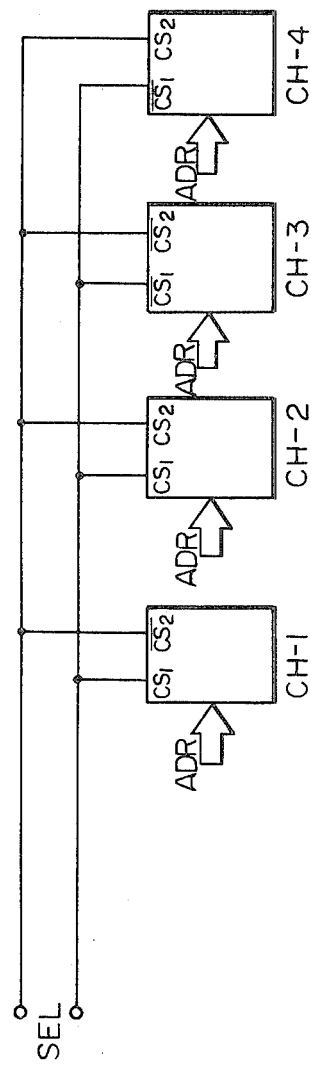

Fig. 4

| SELECTION SIGNALS | | CONTROL SIGNALS | | | | CELL SELECTION |
|---|---|---|---|---|---|---|
| SEL₁ | SEL₂ | S₁ | $\bar{S}_1$ | S₂ | $\bar{S}_2$ | |
| H | L | V | 0 | 0 | V | CELLS No.1 |
| H | H | V | 0 | V | 0 | CELLS No.2 |
| L | L | 0 | V | 0 | V | CELLS No.3 |
| L | H | 0 | V | V | 0 | CELLS No.4 |

SEMICONDUCTOR MEMORY DEVICE WITH DECODER FOR CHIP SELECTION/WRITE IN

BACKGROUND OF THE INVENTION

The present invention relates to a semiconductor memory device, and particularly a semiconductor memory device which provides chip selection means. The semiconductor memory device of the present invention is in the form of a ROM, an EPROM, a PROM, an EAROM or a RAM.

In the system which uses a plurality of memory chips, it is necessary to select the desired memory chip by means of address signal supplied to the system.

In the prior art systems illustrated in FIGS. 1A and 1B, each of the chips CH-1, CH-2, CH-3 and CH-4 provides a chip selection terminal CS or chip selection terminals $CS_1$ ($\overline{CS_1}$) and $CS_2$($\overline{CS_2}$). The chips of FIG. 1B are of the Mask ROM type. The chip selection logic is determined in the wafer processing stage. The chip selection signal SEL which occupies the higher bit portions of the address signal ADR is supplied to the external decoder circuit in FIG. 1A and the chip selection terminals $CS_1$ ($\overline{CS_1}$) and $CS_2$ ($\overline{CS_2}$) in FIG. 1B.

The disadvantage of the prior art system of FIG. 1A is that an external decoder circuit DEC is required to generate from signal SEL the signals to select the desired chip.

The disadvantage of the prior art system of FIG. 1B is that it is impossible to change the select condition of the signals applied to the chip selection terminals $CS_1$ ($\overline{CS_1}$) and $CS_2$ ($\overline{CS_2}$), once they are selected at wafer processing.

The present invention eliminates the disadvantages in the prior art semiconductor memory systems described above.

SUMMARY OF THE INVENTION

The present invention presents a semiconductor memory device in which a memory chip is selected out in accordance with the logic of external selection signals. The semiconductor memory device is characterized by a decoder circuit on the memory chip for receving the external selection signals for selecting a memory chip. The decoder circuit selects a memory chip in accordance with a logic corresponding to the combination of external selection signals. The selected combination can be changed by the user of the semiconductor memory device.

BRIEF DESCRIPTION OF THE DRAWINGS

FIGS. 1A and 1B illustrate prior art semiconductor memory device chip selection systems.

DESCRIPTION OF THE PREFERRED EMBODIMENTS

Figure 2:
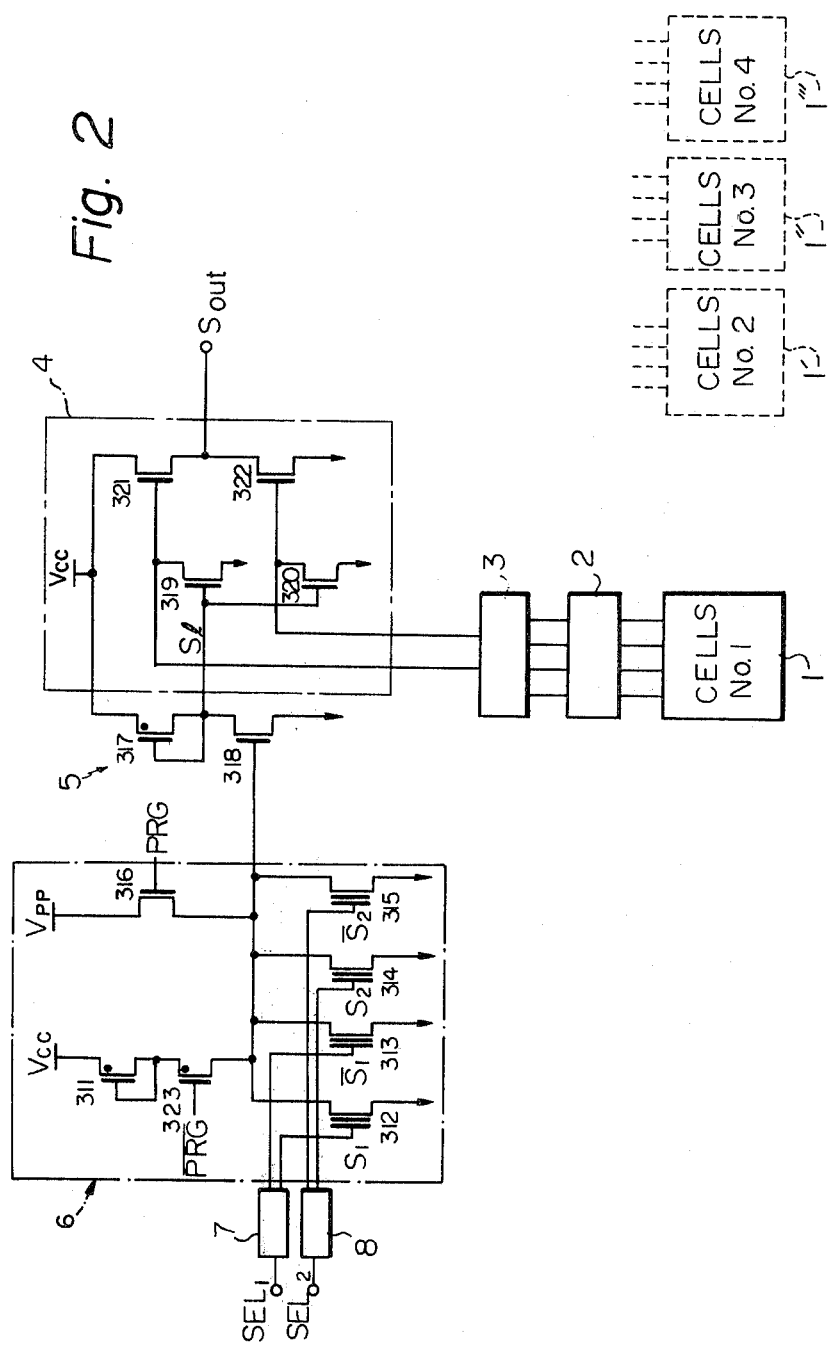
FIG. 2 illustrates a semiconductor memory device embodying the present invention.
Figure 3A:
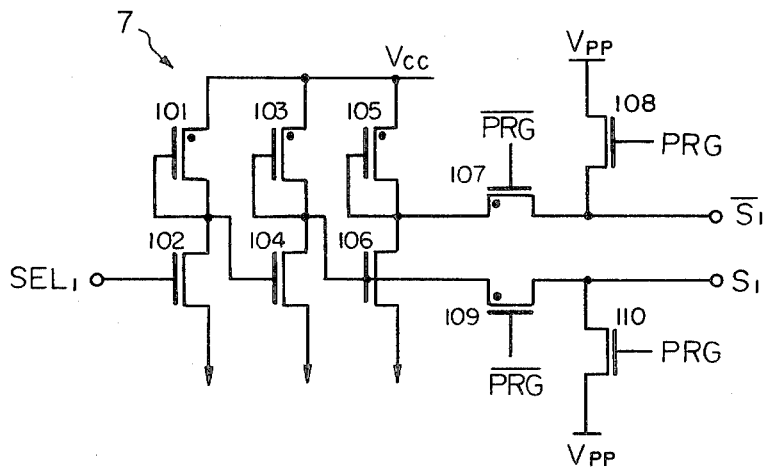
FIGS. 3A and 3B illustrate the control circuits used in the device of FIG. 2, and, FIG. 4 is a table indicating a manner of cell selection in the device of FIG. 2.
Figure 3B:
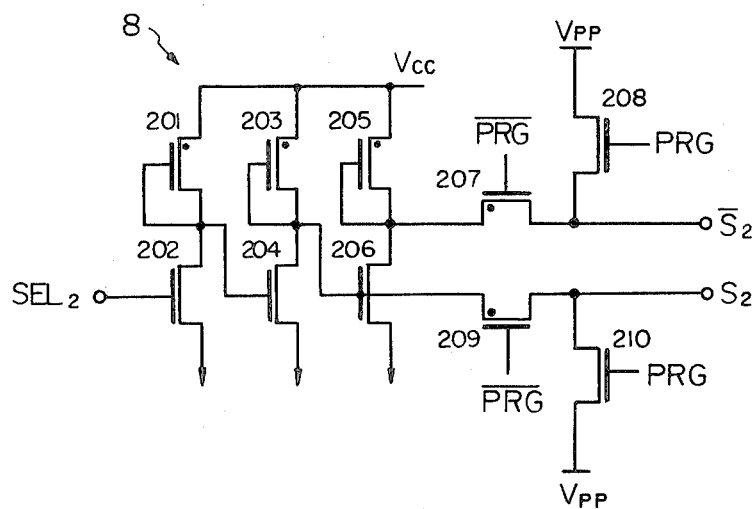

A semiconductor memory device embodying the present invention is illustrated in FIG. 2. The semiconductor memory device of FIG. 2 is an EPROM type. The control circuits 7 and 8 for producing the chip selection signals $S_1$, $\overline{S_1}$, $S_2$ and $\overline{S_2}$ are illustrated in FIGS. 3A and 3B. These signals are applied to the gates of the double gate FAMOS FETs 312, 313, 314 and 315 in the device of FIG. 2.

Control circuit 7 of FIG. 3A comprises depletion type load FETs 101, 103 and 105 connected to a voltage source $V_{cc}$ (e.g., 5 volts), and enhancement type driver FETs 102, 104 and 106, a depletion type FET 107, an enhancement type FET 108, a depletion type FET 109, an enhancement type FET 110 connected to a voltage source $V_{pp}$ (e.g. 25 volt).

The structure of control circuit 8 of FIG. 3B is identical to that of the control circuit 7 of FIG. 3A.

In the writing-in mode, the potential of the signal PRG is HIGH (e.g. 25 volts) and the potential of the signal $\overline{PRG}$ is LOW (0 volt). Accordingly, the potentials of the signals $S_1$ and $\overline{S_1}$ are HIGH or LOW in accordance with the potential of the signal $SEL_1$. The HIGH potential of the signals $S_1$ and $\overline{S_1}$ is equal to the HIGH potential of the signal PRG (e.g. 25 volts), minus the threshold voltage of the FET 108 or FET 110. The LOW potential of the signals $S_1$ and $\overline{S_1}$ is zero volt. In the chip-selection mode, the potential of the signal PRG is LOW (0 volt) and the potential of the signal $\overline{PRG}$ is HIGH (e.g. 5 volts). Accordingly, the potentials of the signals $S_1$ and $\overline{S_1}$ are HIGH (e.g. 5 volts) or low (0 volt) in accordance with the potential of the signal $SEL_1$.

The semiconductor memory device of FIG. 2 comprises a NOR gate circuit portion 6, an inverter circuit portion 5, an output buffer portion 4, a sense circuit 3, a column gate 2 and memory Cells No. 1. The NOR gate circuit portion 6 comprises double gate FAMOS type FEts 312, 313, 314 and 315, an FET 311, an FET 323 and an FET 316.

The inverter circuit portion 5 comprises FETs 317 and 318. The output buffer portion 4 comprises FETs 319, 320, 321 and 322. The output signal $S_I$ of the inverter circuit portion 5 is applied to an input terminal of the output buffer portion 4.

In the NOR gate circuit portion 6, the drains of the FETs 312, 313, 314 and 315 are series connected to the voltage sources $V_{cc}$ through FETs 323 and 311, and to voltage source $V_{pp}$ through FET 316. In the writing-in mode, the potential of the signal PRG is HIGH (e.g. 25 volts) and the potential of the signal $\overline{PRG}$ is LOW (0 volt). In the chip selection mode, the potential of the signal PRG is LOW (0 volt) and the potential of the signal $\overline{PRG}$ is HIGH (e.g. 5 volts). The writing-in of the chip selection logic is usually carried out simultaneously with the writing-in of the information to the memory. The potentials of the signals $SEL_1$ and $SEL_2$ are set so that when in the chip selection mode, the memory cell in question is selected when the signals $SEL_1$ and $SEL_2$ assume potentials. The potentials applied during the writing-in mode of the signals $SEL_1$ and $SEL_2$ must be filed constant while the writing-in of the information into the memory is carried out.

A HIGH potential of a signal $SEL_1$ and the LOW potential of the signal $SEL_2$ are used to realize the chip selection logic in which the memory chip 1 is selected by the high potential of $SEL_1$ signal and the LOW potential of $SEL_2$ signal. When this condition occurs in the writing-in mode, the potential of the signals PRG becomes HIGH (e.g. 25 volts) and the potential of the signal $\overline{PRG}$ becomes LOW (0 volt). Accordingly, the potentials of the signals $S_1$ and $\overline{S_2}$ become HIGH, that is 25 volts minus the threshold voltage of the FET 110 or FET 208. Also, the potentials of the signals $\overline{S_1}$ and $S_2$ become LOW (0 volt). Electrons are injected into the floating gates of the FETs 312 and 315, in accordance with the well-known operative characteristics of the floating gate type EPROM, due to the application of a HIGH (approximately 20 volts) voltage to the drains of the FETs whose gate potentials are HIGH. As a result, the threshold voltages of FETs 312 and 315 are caused to shift to a positive value of, for example, 8 volts. No electrons are injected into the floating gates of the FETs 313 and 314 whose gate potentials are LOW. Therefore, the threshold voltages of the FETs 313 and 314 are unchanged and are remain at the original value of, for example, 2 volts.

After a chip selection logic is written into the NOR gate circuit portion 6 with the aid of control circuits 7 and 8 of FIGS. 3A and 3B, the data stored in the Cells No. 1 is read out as the output signal $S_{out}$ at the output terminal of the output buffer circuit 4 only when the predetermined levels of $SEL_1$ and $SEL_2$ are applied to the gates of FETs 102 and 202. When the potential of the signal $SEL_1$ is HIGH and the potential of the signal $SEL_2$ is LOW, the potentials of the signals $S_1$ and $\overline{S_2}$ are HIGH (e.g. 5 volts) and the potentials of the signals $\overline{S_1}$ and $S_2$ are LOW (0 volt), and all of the FETs 312, 313, 314 and 315 are brought to the cut-off state, because the thread voltages of the FETs 312 and 315 are higher than the HIGH applied gate potential (e.g. 5 volts). Thus, the potential of the signal $S_I$ is LOW (0 volt), and both FET 319 and FET 320 are brought to the cut-off state. Accordingly, the output signal $S_{out}$ which corresponds to the information stored in the memory cells 1 is obtained.

When the potential condition of the signals $SEL_1$ and $SEL_2$ is other than the above assumed condition, at least one of the potentials of the signals $S_1$ and $\overline{S_2}$ is HIGH (e.g. 5 volts), and at least one of the FETs 313 314 is in the ON state. Thus, the potential of the signal $S_I$ is HIGH (e.g. 5 volts), and FETs 319 and 320 are in the ON state and the FETs 321 and 322 are in the cut-off state. Accordingly, no output signal $S_{out}$ is obtained.

Similarly, the chip selection logic will be written into the chips so that the Cells No. 2 are selected under the condition that both the selection signals $SEL_1$ and $SEL_2$ are in HIGH state, the Cells No. 3 are selected under the condition that both the selection signals $SEL_1$ and $SEL_2$ are in LOW state, and the Cells No. 4 are selected under the condition that the selection signal $SEL_1$ is in LOW state and the selection signal $SEL_2$ is in HIGH state. The manner of cell selection described above is tabulated in FIG. 4.

Thus, if the chip selection logic has been stored in the device of FIG. 2, the data in the memory cells in question can be read out by applying the signals $SEL_1$ and $SEL_2$ which correspond to the higher bit portions of the address signal, without providing external decoder circuits.

The erasure of the chip selection logic stored in the device of FIG. 2 is carried out by means of, for example, the irradiation of the ultra-violet ray, simultaneously with the erasure of the data stored in the memory cells. In this case, electrons stored in the floating gates in the FAMOS type FETs 312 through 315 are eliminated by the ultra-violet irradiation. Therefore, it is possible to set a new logic state of the FETs of the NOR gate circuit portion 6 when data is next written into the Cells Nos. 1 through 4. Thus, changing the active logic state of the FETs of the NOR gate circuit portion 6 is possible.

If it is desired that one of the Cells Nos. 1 through 4 is always selected, as in the case of the so-called "DON'T CARE" selection, such selection can be achieved by bringing all of the FETs 312, 313, 314 and 315 to the inoperative state by effecting the writing-in twice with a HIGH and a LOW level signal applied at the $SEL_1$ and $SEL_2$ terminals.

What is claimed is:

1. A semiconductor memory device for receiving a plurality of external selection signals in which a semiconductor memory chip of said device is selected in accordance with a predetermined combination of the external selection signals, said device comprising:
    a semiconductor memory chip; and
    a decoder circuit for receiving said external selection signals and provided in said semiconductor memory device, said decoder circuit selecting said semiconductor memory chip in accordance with a logic corresponding to the predetermined combination of said external selection signals, said logic capable of being changed by the user of said semiconductor memory device.

2. A semiconductor memory device for receiving a plurality of external selection signals, having a writing-in mode and a chip selection mode in which a semiconductor memory chip of said device is selected in accordance with a predetermined combination of the external selection signals, said device comprising:
    a semiconductor memory chip;
    a control circuit for receiving said external selection signals and producing a first output signal and its inversion in the writing-in mode and a second output signal and its inversion in the chip selection mode; and
    a decoder circuit for receiving said first and second output signals and their inversions for writing into said semiconductor memory chip or selecting said semiconductor memory chip;
    wherein said control circuit and said decoder circuit are provided in said semiconductor memory device, data is written into said semiconductor memory chip in response to the writing-in mode and said first output signal and its inversion to said decoder circuit, and said semiconductor memory chip is selected in response to the chip selection mode and applying said second output signal and its inversion to said decoder circuit.

3. A semiconductor memory device as defined in claim 2, wherein said control circuit comprises:
    an inverter circuit including a plurality of transistors; and
    an output control circuit for receiving a variable gate voltage and including a plurality of transistors, the gates of each transistor connected to receive said variable gate voltage.

4. A semiconductor memory device as defined in claim 2, wherein said decoder circuit comprises control circuits for receiving a variable gate voltage, each control circuit includes a plurality of transistors, the gates of each transistor operatively connected to receive said variable gate voltage.

5. A semiconductor memory device as defined in claim 3 or 4, wherein said variable gate voltage is high in response to the writing-in mode, and is zero in response to the chip selection mode.

6. A semiconductor memory device having a plurality of memory cell groups, each having selected and non-selected states, said device comprising:
    means for selecting said memory cell groups and for receiving a plurality of external memory cell select signals having a plurality of input signal combinations, each select signal having active and inactive states, said selecting and receiving means having a plurality of outputs correspondingly, connected to said plurality of memory cell groups said outputs vary selectively in response to said plurality of input signal combinations, select predetermined corresponding memory cell groups and place in the non-selected state, the remainder of said memory cell groups; and means for allowing the user of said semiconductor memory device to change said predetermined corresponding memory cell group selected in response to each one of said plurality of said input signal combinations.

7. A semiconductor memory device having a write-in mode and a chip selection mode, a plurality of memory cell groups each having selected and non-selected states, said device comprising:

decoder circuit for receiving a relatively high power supply voltage and a relatively low power supply voltage, having a plurality of outputs correspondingly, operatively connected to said plurality of memory cell groups, for selecting said memory cell groups, said memory cell groups being selected in accordance with said plurality of input signal combinations; and, control circuit for receiving a relatively high power supply voltage and a relatively low power supply voltage, and for receiving external memory cell select signals having a plurality of input signal combinations, each select signal having active and inactive states comprising a plurality of input signal combinations, said control circuit having a first output signal and its inversion for application to said decoder circuit varying in response to said plurality of input combinations and said writing-in mode, and a second output signal and its inversion for application to said decoder circuit varying in response to said plurality of input signal combinations and said chip selection mode; and wherein the writing-in of data into said semiconductor memory device is enabled by said first output signal and its inversion and the selection of said semiconductor memory device is enabled by said second output signal at its inversion.

8. A semiconductor memory device according to claim 2 or 7, wherein said control circuit comprises:

an inversion circuit for receiving one of said plurality of external memory select signals, and having a first and a second output, said inversion circuit including a group of depletion type enhancement type inverters including a plurality of enhancement type transistors and a plurality of depletion type transistors, the drains of said plurality of enhancement type transistors are correspondingly connected to the sources of said plurality of depletion type transistors and the gate and source of each said plurality of depletion type transistors are connected together, the drain of each of said plurality of depletion type transistors is connected to a relatively low voltage supply and the sources of said plurality of enhancement type transistors are connected to ground, the gate of each of said plurality of enhancement type transistors being the input for each of said inverters and the drain source junction of each inverter being the output of said inverter, and wherein said inverters are connected in series; and an output control circuit including a plurality of depletion type transistors, a plurality of enhancement type transistors, wherein the drains of said plurality of depletion type transistors are connected to said inversion circuit, the gate of each depletion type transistor is operatively connected to a first variable gate voltage supply and the gate of each enhancement type transistor is operatively connected to a second variable gate voltage supply, the drains of said plurality of enhancement type transistor is operatively connected to a relatively high supply voltage and the sources of said plurality of enhancement type transistors are connected to corresponding sources of said depletion type transistors and operatively to said decoder circuit.

9. A semiconductor memory device according to claim 2 or 7, wherein said decoder circuit further comprises:

first control circuit comprising a plurality of depletion type transistors connected such that at least one pair of series connected depletion type transistors is formed, wherein the drain of a first transistor of said pair is operatively connected to a relatively low supply voltage, the gate of said first transistor is operatively connected to the source of said first transistor and to the drain of the second transistor of said pair, the gate of said second transistor is operatively connected to a first variable gate voltage supply, and the source of said second transistor is operatively connected to said decoder means; and second control circuit comprising at least one enhancement type transistor wherein the rate of said enhancement type transistor is operatively connected to a second variable gate voltage supply, the drain of said enhancement type transistor is operatively connected to a high supply voltage, and the source of said enhancement type transistor is operatively connected to the source of said second transistor of said depletion type transistor pair.

10. A semiconductor memory device according to claim 2 or 7, wherein said decoder circuit further comprises:

a plurality of double gate transistors connected in parallel pairs, such that the drains of said double gate transistors are operatively connected together, the source of each double gate transistor is operatively connected to ground, and the gates of said parallel pairs are operatively connected to said control circuit for receiving external selection signals.

11. A semiconductor memory device according to claim 10, wherein said decoder circuit further comprises:

an output inversion circuit comprising a series connection of an enhancement type transistor and a depletion type transistor, wherein the gate and source of said depletion type transistor are operatively connected to the drain of said enhancement type transistor, the gate of said enhancement type transistor is operatively connected to said drains of said double gate transistors, the source of said enhancement type transistor is operatively connected to ground and, the drain of said depletion type transistor is operatively connected to a relatively low supply voltage.

12. A semiconductor memory device according to claim 2 or 7, wherein said device further comprises an output buffer circuit including first transistor with its drain correspondingly, operatively connected to said memory cell group;

second transistor with its drain correspondingly, operatively connected to said memory cell group and with its gate operatively connected to the gate of said first transistor and operatively connected to said decoder circuit;

third transistor with its gate operatively connected to said drain of said second transistor, the source of said third transistor is operatively connected to the sources of said first and second transistors and to ground; and fourth transistor with its gate operatively connected to said drain of said first transistor, with its source operatively connected to the drain of said third transistor, and with its drain operatively connected to a relatively low supply voltage.

* * * * *

UNITED STATES PATENT AND TRADEMARK OFFICE
CERTIFICATE OF CORRECTION

PATENT NO. : 4,392,212

DATED : July 5, 1983

INVENTOR(S) : MIYASAKA ET AL.

It is certified that error appears in the above-identified patent and that said Letters Patent is hereby corrected as shown below:

```
Column 1, line 40, delete "out";
          line 47, after "of" insert --the--;
Column 2, line 14, "PRG" should be --PRG--;
          line 35, "S_i" should be --S_e--;

line 55, "filed" should be --held--;
          line 60, "high" should be --HIGH--;
          line 62, "signals" should be --signal--;
Column 3, line 25, "thread" should be --threshold--;
          line 27, "S_i" should be --S_ℓ--;

line 35, "S_i" should be --S_ℓ--;

line 36, delete "and"; (first occurrence)
Column 6, line 36, "rate" should be --gate--;
```

Signed and Sealed this

Fifteenth Day of May 1984

[SEAL]

Attest:

GERALD J. MOSSINGHOFF

Attesting Officer

Commissioner of Patents and Trademarks